(12) United States Patent
Machida et al.

(10) Patent No.: US 7,692,438 B2
(45) Date of Patent: Apr. 6, 2010

(54) BIMETALLIC PROBE WITH TIP END

(75) Inventors: Kazumichi Machida, Takarazuka (JP); Atsuo Urata, Ibaraki (JP); Takeshi Konno, Tsukuba (JP); Akira Ishida, Tsukuba (JP); Mitsuru Egashira, Tsukuba (JP); Mikihiko Kobayashi, Ishioka (JP)

(73) Assignees: National Institute for Materials Science, Tsukuba (JP); Japan Electronic Materials Corporation, Amagasaki (JP)

( * ) Notice: Subject to any disclaimer, the term of this patent is extended or adjusted under 35 U.S.C. 154(b) by 413 days.

(21) Appl. No.: 10/565,156

(22) PCT Filed: May 19, 2005

(86) PCT No.: PCT/JP2005/009177

§ 371 (c)(1),
(2), (4) Date: Jan. 19, 2006

(87) PCT Pub. No.: WO2005/116667

PCT Pub. Date: Dec. 8, 2005

(65) Prior Publication Data

US 2008/0054916 A1    Mar. 6, 2008

(30) Foreign Application Priority Data

May 31, 2004  (JP) .............................. 2004-161844

(51) Int. Cl.
*G01R 31/02* (2006.01)

(52) U.S. Cl. ...................................................... 324/761
(58) Field of Classification Search ................ None
See application file for complete search history.

(56) References Cited

U.S. PATENT DOCUMENTS

| 3,870,978 | A | * | 3/1975 | Dreyer | ......................... 333/260 |
| 4,993,957 | A | * | 2/1991 | Shino | ........................... 439/86 |
| 5,225,777 | A | | 7/1993 | Bross et al. | |
| 6,577,147 | B2 | * | 6/2003 | Ding et al. | .................. 324/761 |
| 6,710,608 | B2 | * | 3/2004 | Yoshida et al. | .............. 324/754 |

(Continued)

FOREIGN PATENT DOCUMENTS

| JP | 06-082481 | 3/1994 |
| JP | 6-82481 | 3/1994 |
| JP | 2002-55119 | 2/2002 |
| JP | 2002-231399 | 8/2002 |

*Primary Examiner*—Paresh Patel
(74) *Attorney, Agent, or Firm*—Kratz, Quintos & Hanson, LLP

(57) ABSTRACT

It is an object of the present invention to provide a probe which can provide stable electrical conduction to an electrode of an object to be measured even when it is miniaturized. A probe 100 comprises a columnar contact part 110 which can come in contact with an electrode 10 of an object to be measured almost perpendicularly, and a base end (not shown) connected to the contact part 110, the contact part 110 comprises a base part 111 and an expansion part 111*a* bonded to an end of the base part 111 in a width direction, and the expansion part 111*a* is formed of a material having a thermal expansion coefficient higher than that of the base part 111.

2 Claims, 7 Drawing Sheets

U.S. PATENT DOCUMENTS

| | | | |
|---|---|---|---|
| 6,724,203 B1 * | 4/2004 | Goldmann et al. | 324/754 |
| 6,791,345 B2 * | 9/2004 | Maruyama et al. | 324/754 |
| 7,176,703 B2 * | 2/2007 | Flechsig et al. | 324/754 |
| 2002/0105347 A1 | 8/2002 | Maruyama et al. | |
| 2002/0113612 A1 * | 8/2002 | Nguyen | 324/761 |
| 2005/0099195 A1 * | 5/2005 | Machida et al. | 324/754 |

* cited by examiner

BIMETALLIC PROBE WITH TIP END

BACKGROUND OF THE INVENTION

1. Field of the Invention

The present invention relates to a probe which is used for measuring electrical characteristics of an object to be measured.

2. Description of the Related Art

This kind of probe comprises a rectilinear contact part, and this contact part comes in contact with an electrode of an object to be measured almost perpendicularly (refer to Japanese Unexamined Patent Publication No. 2002-055119).

However, since the contact part of the probe is so constituted that it comes in contact with the electrode almost perpendicularly, it is difficult to slide the contact part on the electrode in a lateral direction. That is, since it is difficult for the probe to scrub the electrode, an insulation film such as an oxide film attached on the electrode cannot be removed. Thus, contact resistance between the probe and the electrode is increased and, as a result, a contact defect is likely to be generated.

This problem can be solved by pressing the probe to the electrode with a high contact pressure by overdriving in order to make the probe scrub the electrode. However, since the recent probe is miniaturized as the object to be measured becomes highly integrated, it is difficult to press the probe to the electrode with a high contact pressure. That is, since the above problem is not solved, it is difficult to implement stable electrical conduction between the probe and the electrode.

SUMMARY OF THE INVENTION

The present invention has been devised in view of the above circumstances and it is an object of the present invention to provide a probe which can implement stable electrical conduction between the probe and an electrode of an object to be measured even when it is miniaturized.

In order to solve the above problem, a probe according to the present invention comprises an almost rectilinear contact part which can come in contact with an electrode of an object to be measured almost perpendicularly, and a base end continued to the contact part, characterized in that the contact part further comprises a base part and an almost rectilinear junction part which is formed of a material having a thermal expansion coefficient different from that of the base part and provided integrally and longitudinally along a widthwise end of the base part, and said contact part is deformed in a direction almost perpendicular to the longitudinal direction of said base part due to respective thermal expansion of said base part and said junction part at 85 to 125° C.

In addition, another probe according to the present invention comprises an almost rectilinear contact part which can come in contact with an electrode of an object to be measured almost perpendicularly; and a base end continued to the contact part, characterized in that said contact part further comprises a base part and a junction part which is integrally provided at a widthwise end of said base part, said junction part is formed of a shape memory alloy which can be expanded or contracted in a longitudinal direction of said base part at 80 to 90° C., and said contact part is deformed in a direction almost perpendicular to the longitudinal direction of said base part due to deformation of said junction part.

In the case of the probe according to claim 1 of the present invention, the rectilinear contact part comprises the base part and the almost rectilinear junction part which is formed of the material having the thermal expansion coefficient different from that of the base part and provided integrally and longitudinally along a widthwise end of the base part. That is, since the contact part is bimetal, when the contact part comes in contact almost perpendicularly with the electrode of the object to be measured at an environmental temperature of 85 to 125° C. and overdriving is performed in this state, each of the base part and the junction part is expanded by heat in the above temperature range transferred from the electrode of the object to be measured and the contact part is deformed in a direction almost perpendicular to the longitudinal direction of the base part (in a direction of either the base part or the junction part which has a smaller thermal expansion coefficient). By this formation, a tip end of the contact part scrubs the electrode of the object to be measured. Thus, since an insulation film such as an oxide film attached on the electrode can be scrubbed out, contact resistance between the contact part and the electrode can be reduced without pressing the contact part against the electrode with a high contact pressure like a conventional example. As a result, stable electric conduction between the contact part of the probe and the electrode of the object to be measured can be implemented without causing a contact defect even when the probe is miniaturized.

In the case of the probe according to claim 2 of the present invention, the rectilinear contact part comprises the base part and the junction part which is formed of a shape memory alloy which can be expanded or contracted in the longitudinal direction of the base part at 80 to 90° C. and integrally provided at a widthwise end of said base part. Therefore, when the contact part comes in contact almost perpendicularly with the electrode of the object to be measured at the above temperature and overdriving is performed in this state, the junction part is deformed by heat in the above temperature range transferred from the electrode of the object to be measured and the contact part is deformed in a direction almost perpendicular to the longitudinal direction of the base part. By this deformation, a tip end of the contact part scrubs the electrode of the object to be measured. Thus, since the insulation film such as the oxide film attached on the electrode can be scrubbed out, contact resistance between the contact part and the electrode can be reduced without pressing the contact part against the electrode with a high contact pressure like the conventional example. As a result, stable electric conduction between the contact part of the probe and the electrode of the object to be measured can be implemented without causing a contact defect even when the probe is miniaturized.

BRIEF DESCRIPTION OF THE DRAWINGS

FIG. 7(*b*) is a three-dimensional view showing a state in which the sane contact part scrubs an electrode.

EXPLANATION OF REFERENCE NUMERALS

Figure 1:
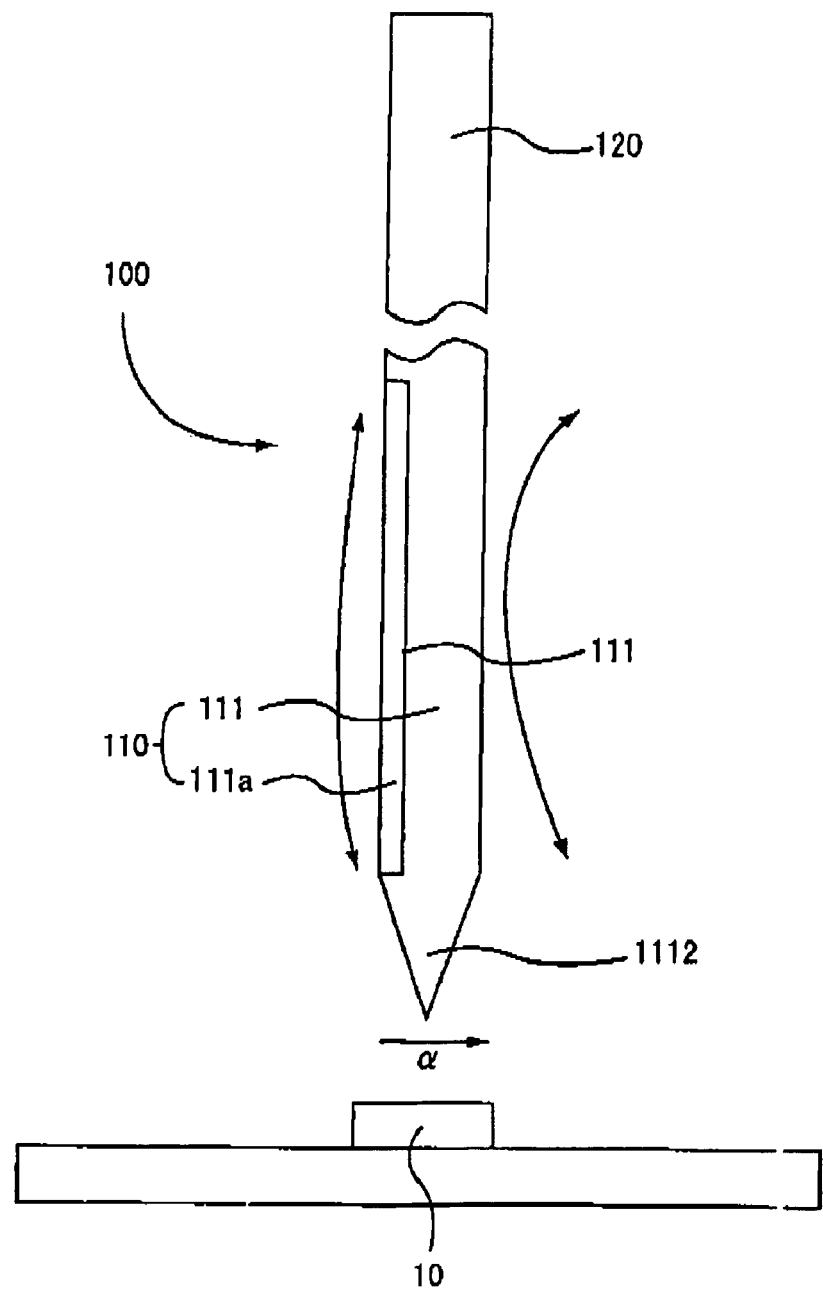
FIG. 1 is a schematic sectional view showing a probe according to Embodiment 1 of the present invention.

100 Probe
110 Contact part
111 Base part
111a Expansion part
200 Probe
210 Contact part
211 Base part
211a Deformation part

DETAILED DESCRIPTION OF THE PREFERRED EMBODIMENTS

Hereinafter, embodiments of the present invention will be described.

Embodiment 1

Figure 2:
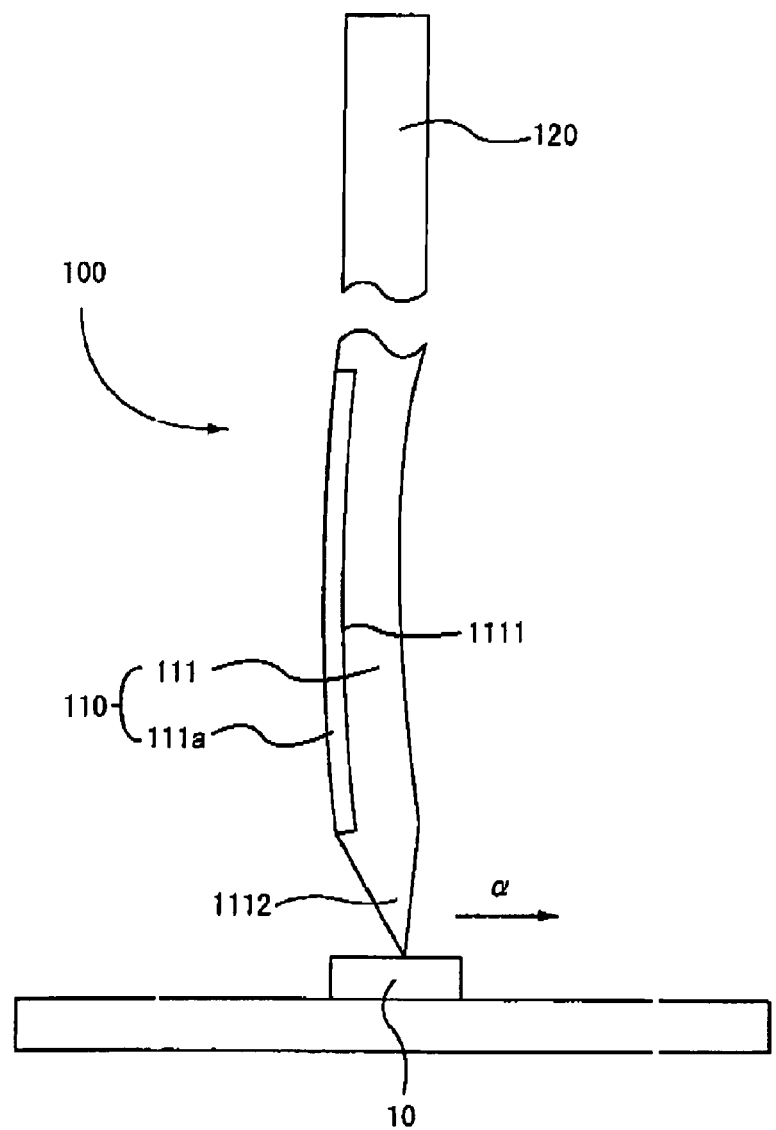
FIG. 2 is a schematic sectional view showing a state in which the probe scrubs an electrode.
Figure 3:
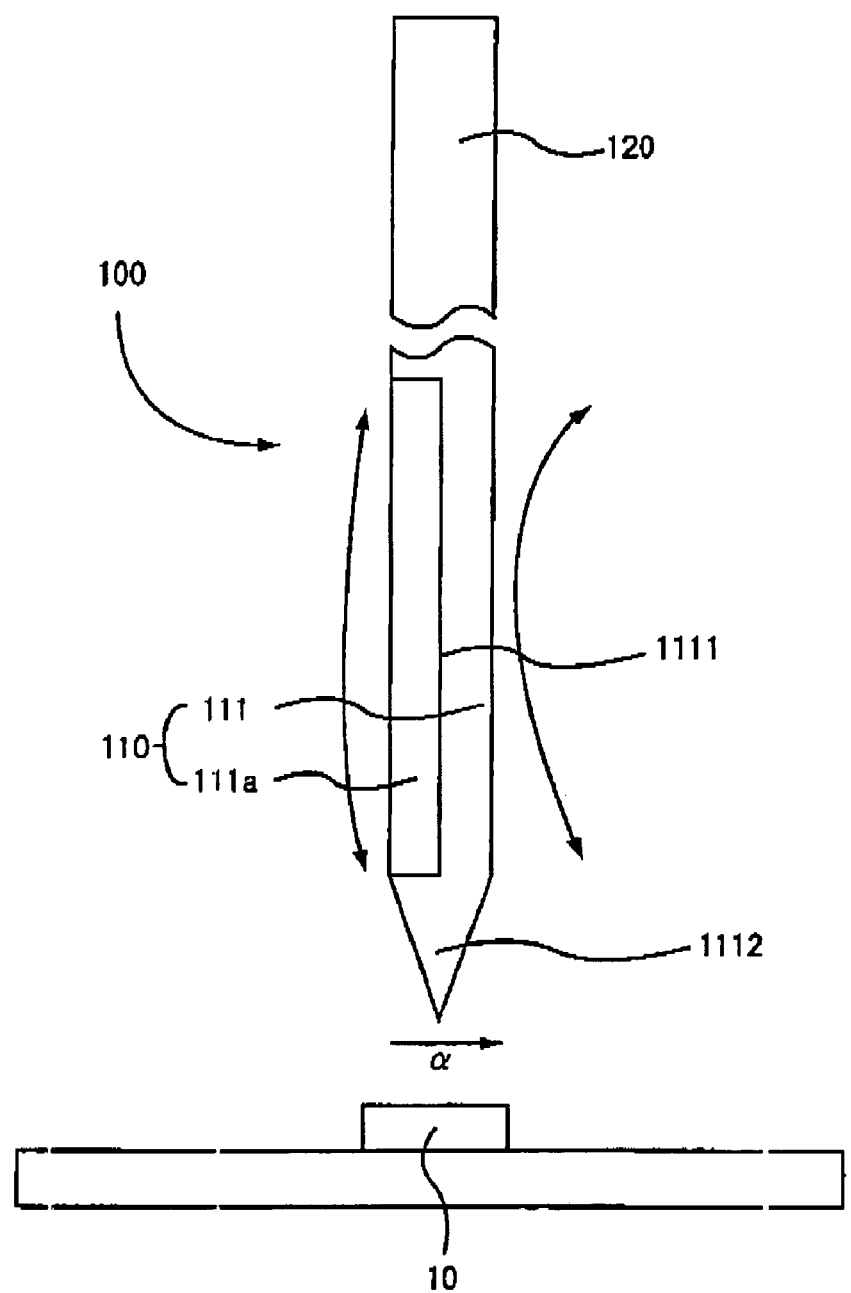
FIG. 3 is a schematic sectional view showing a variation in design of the probe.

First, a probe according to Embodiment 1 of the present invention will be described with reference to the drawings. FIG. 1 is a schematic sectional view showing the probe according to Embodiment 1 of the present invention, FIG. 2 is a schematic sectional view showing a state in which the probe scrubs an electrode, and FIG. 3 is a schematic sectional view showing a variation in design of the contact part of the probe.

A probe 100 shown in FIG. 1 comprises a base end 120 provided on a substrate which constitutes a probe card, and a columnar contact part 110 which is connected to the base end 120 and can come in contact with an electrode 10 of an object to be measured almost perpendicularly. Herein, the base end 120 may have any shape.

The contact part 110 comprises a base part 111 whose tip end is sharply pointed and an expansion part 111a (that is, a junction part) having a rectangular shape as viewed from longitudinal section (tat is, almost rectilinear shape) and integrally and longitudinally along a widthwise end 1111 of the base part. The expansion part 111a is formed of a material having a thermal expansion coefficient higher than that of the base part 111. That is, the contact part 110 is bimetal. According to the contact part 110, the base part 111 is formed of invar having a thermal expansion coefficient of 0.4×10-6 and the expansion part 111a is formed of brass having a thermal expansion coefficient of 20×10-6 so that it can function as bimetal at an environmental temperature of 85 to 125° C. as shown in FIG. 2.

The contact part 110 of the probe 100 is manufactured by bonding tie expansion part 111a along the widthwise end 1111 of the base part 111 using various kinds of well-known plating techniques or bonding techniques.

Heating means is a wafer chuck (not shown) on which an object to be measured is set. The burn-in heating means can heat an environmental temperature of the object to be measured at 85 to 125° C.

As described above, the probe 100 has a constitution in which the expansion part 111a having the almost rectangular shape as viewed from the longitudinal section is bonded along the longitudinal direction at the widthwise end 1111 of the base part 111 of the contact part 110. That is, the contact part 110 is bimetal. Thus, the probe card comprising The probe 100 is mounted on a prober (not shown). Meanwhile, when the prober is operated in a state the object to be measured is set an the heating means and the environmental temperature is attained at 85to 125° C. by the heating means, the contact part 110 of the probe 100 relatively comes close to the oh cc to be measured and comes in contact with the electrode 10 of the object to be measured perpendicularly. In this state, when the contact part 110 of the probe 100 comes close to the electrode 10 of the object to be measured more closely and overdriving is performed, each of the base part 111 and the expansion part 111a of the contact part 110 is thermally expanded by the heat of the environmental temperature transferred through the electrode 10 of the object to be measured, so that the contact part 110 is curved toward a direction α of the base part 111 because the base part 11. has a smaller thermal expansion coefficient (that is, the contact part 110 is deformed in a direction almost perpendicular to the longitudinal direction of the base part 111 (refer to FIG. 2)). When the contact part 110 is deformed, the tip cad 1112 of The contact part 110 scrubs the electrode 10 of the object to be measured. Thus, since an insulation film such as an oxide film attached on the electrode 10 can be scrubbed out, contact resistance between the contact part 110 and the electrode 10 can be lowered without pressing the contact part 110 against the electrode 10 with a high contact pressure like the conventional example. Thus, even when the probe 100 is miniaturized, stable electric conduction between the contact part 110 of the probe 100 and the electrode 10 of the object to be measured can be implemented without causing a contact defect.

The probe 100 may be changed in design as long as it comprises an almost rectilinear contact part which can come in contact with the electrode of the object to be measured almost perpendicularly, and a base end connected to the contact part, the contact part comprises a base part and an almost rectilinear junction part formed of a material having a thermal expansion coefficient different from that of the base part and provided integrally and longitudinally along a widthwise end of the base part, and the contact part is deformed in a direction almost perpendicular to the longitudinal direction of the base part when each of the base part and the junction part is thermally expanded at 85 to 125° C.

That is, the contact part 110 can be changed in design as long as it can function as bimetal. For example, as shown in FIG. 3, almost half of the base part 111 can be the expansion part 111a. Alternatively, the base part 111 may be formed of a material having a thermal expansion coefficient higher than that of the expansion part 111a.

Although the contact part 110 is in the shape of the column in the above embodiment, it may have another shape as long as it is rectilinear. The tip end of the contact part 110 is not necessarily sharply pointed. In addition, it is needless to say that a constitution of the probe card may be any constitution as long as it comprises the probe 100 and a substrate on which the probe 100 is provided.

Embodiment 2

Figure 4:
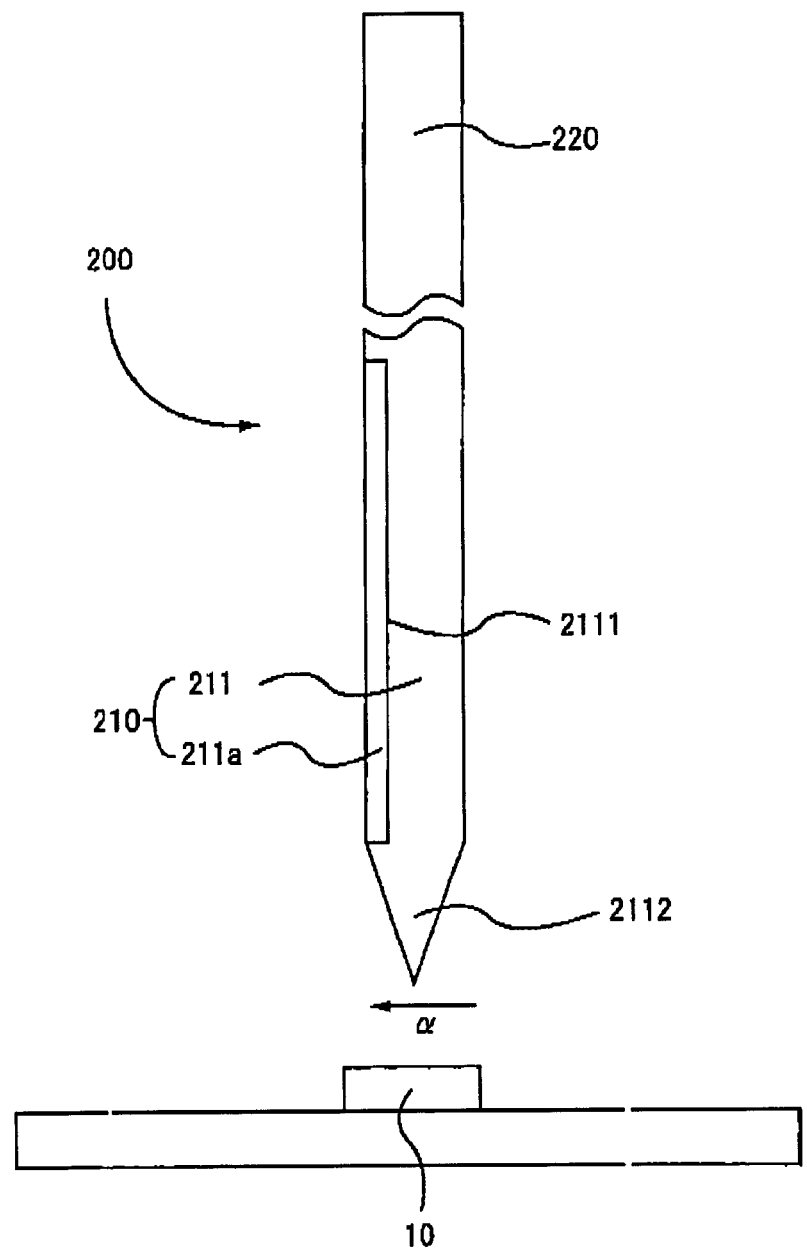
FIG. 4 is a schematic sectional view showing a probe according to Embodiment 2 of the present invention.

A probe 200 shown in FIG. 4 comprises a base end 220 provided on a substrate which constitutes a probe card, acid a columnar contact part 210 which is connected to the base end 220 and can came in contact with an electrode 10 of an object to be measured almost perpendicularly. In addition, the base end 220 may have any shape.

The contact part 210 comprises a base part 211 whose tip end is sharply pointed and a deformation part 211a (that is, a junction part) having a rectangular shape as viewed from longitudinal section and integrally provided in a longitudinal direction along widthwise end 2111. of the base part 211. The base pert 211 is formed of a material which can be elastically deformed, such as tungsten. Meanwhile, the deformation part 211a is fanned of a shape memory alloy which is contracted in a longitudinal direction of the base part 211 at 80 to 90° and returns to its original length at 50 to 60° C. Examples of this shape memory alloy include titanin n-nickel (Ti—Ni) which is contracted at 85° C., and the like.

The contact part 210 is manufactured by bonding the deformation part 211a to the widthwise end 2111 of the base part 211 in the width direction by a wall-known resistance welding technique. As another bonding method, a diffusion welding, surface modifying technique or the like can be used.

Heating means is a wafer chuck (not shown) on which an object to be measured is set. The burn-in heating means can heat an environmental temperature of the object to be measured to 85° C. or more.

Figure 5:
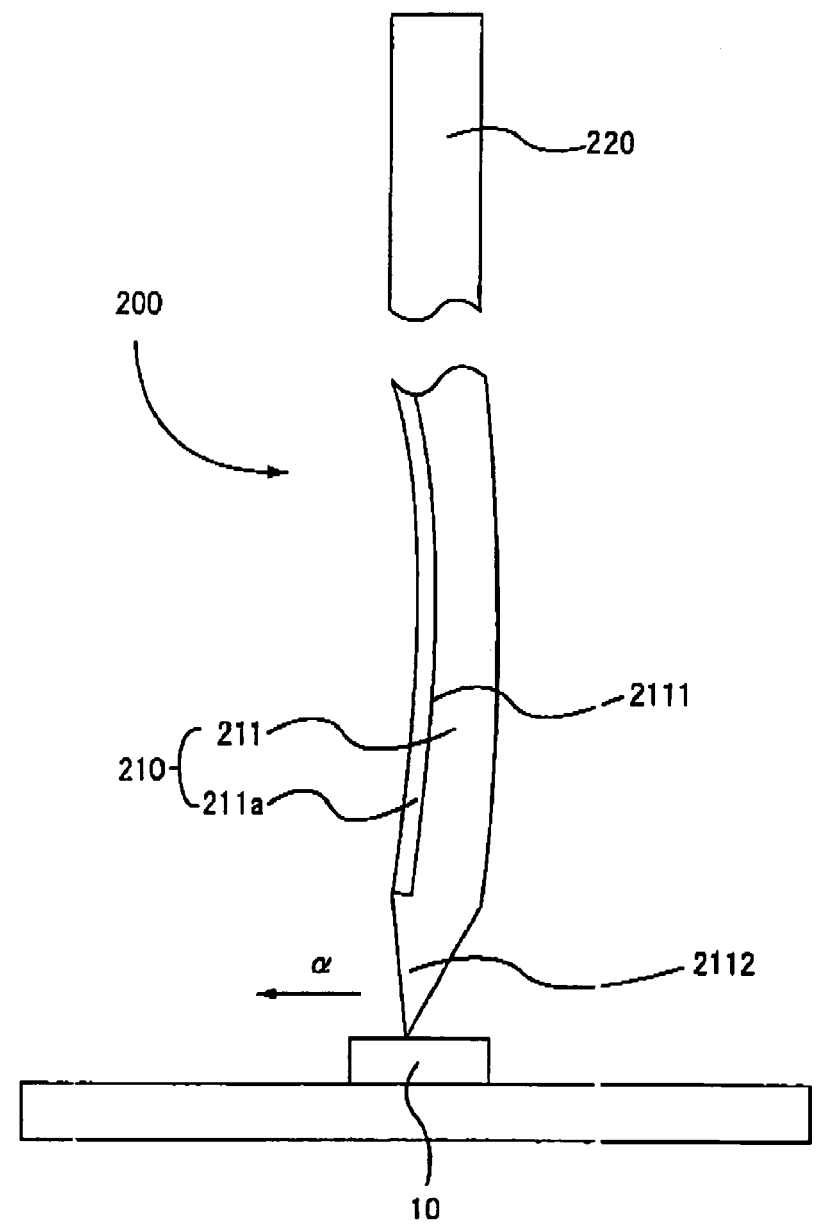
FIG. 5 is a schematic sectional view showing a state in which the probe scrubs an electrode.

As described above, the probe 200 has a constitution in which the deformation part 211a which can be contracted in the longitudinal direction of the base part 211 is bonded to the widthwise end 2111 of the base part 211 of the contact part. Thus, the probe card comprising the probe 200 is mounted on a prober (not shown). Meanwhile, when the prober is operated in a state in which the object to be measured is set on the heating means and the environmental temperature is attained at 85° C. or more by the heating means, the contact part 210 of the probe 200 relatively comes close to the object to be measured and comes in contact with the electrode 10 of the object to be measured perpendicularly. In this state, when the contact part 210 of the probe 200 comes close to the electrode 10 of the object to be measured more closely and overdriving is performed, the deformation part 211a of the contact part 210 is contracted in the longitudinal direction of the base part 211 by the heat of the environmental temperature transferred through the electrode 10 of the object to be measured, so that the contact part 210 is curved (that is, the contact part 210 is deformed in a direction α almost perpendicular to the longitudinal direction of the base 211 (refer to FIG. 5)). When the contact part 210 is deformed, the tip end 2112 of the contact part 110 scrubs the electrode 10 of the object to be measured. Thus, since an insulation film such as an oxide film attached on the electrode 10 can be scrubbed out contact resistance between the contact part 210 and the electrode 10 can be lowered without pressing the contact part 110 against the electrode 10 with a high contact pressure like the conventional example. Thus, even when the probe 200 is miniaturized, stable electric conduction between the contact part 210 of the probe 200 and the electrode 10 of the object to be measured can be implemented without causing a contact defect.

The probe 200 may be changed in design as long as it comprises an almost rectilinear contact part which can come in contact with the electrode of the object to be measured almost perpendicularly, and a base end connected to the contact part, the contact part comprises a base part and a junction part integrally provided at an end of the base part in a width direction, the junction part is formed of a shape memory alloy which can be expanded or contracted in the longitudinal direction of the base part at 80 to 90° C., and the contact part is deformed in a direction almost perpendicular to the longitudinal direction of the base part when the junction part is deformed.

Figure 6:
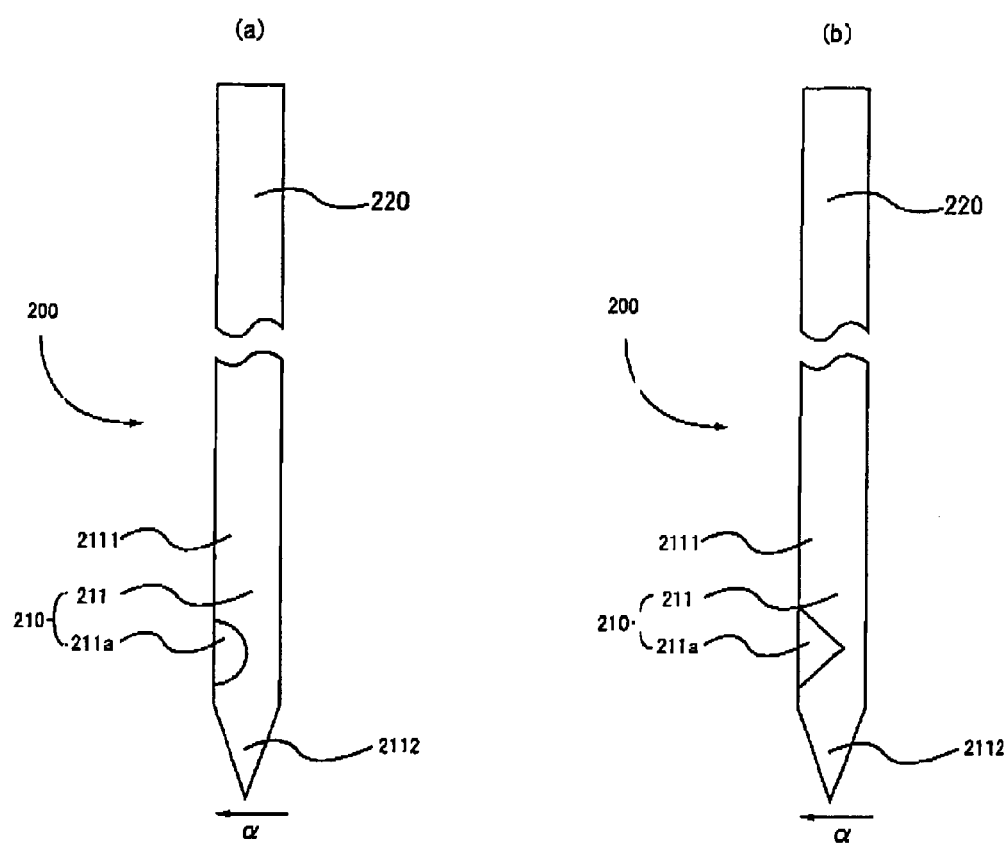
FIG. 6 is a schematic sectional view showing a variation in design of the probe, in which (a) is a schematic sectional view showing a case in which an arc-shaped deformation part is provided, and (b) is a schematic sectional view showing a case in which a triangle pyramid-shaped deformation part is provided.
Figure 7A:
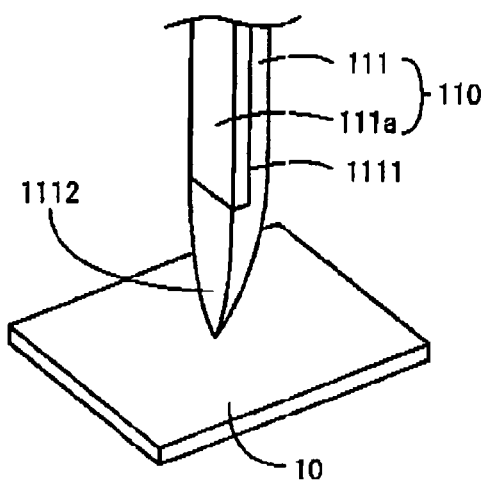
FIG. 7(*a*) is a three-dimensional view showing the contact part of the probe according to Embodiment 1.
Figure 7B:
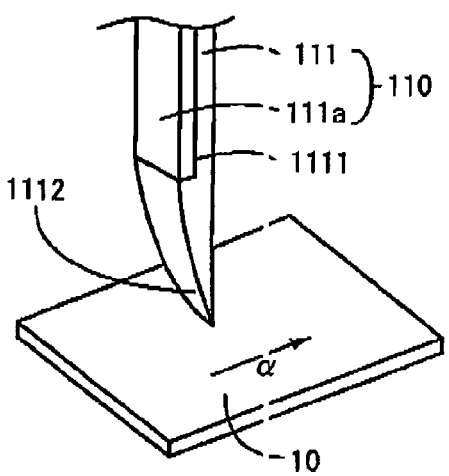
Figure 8A:
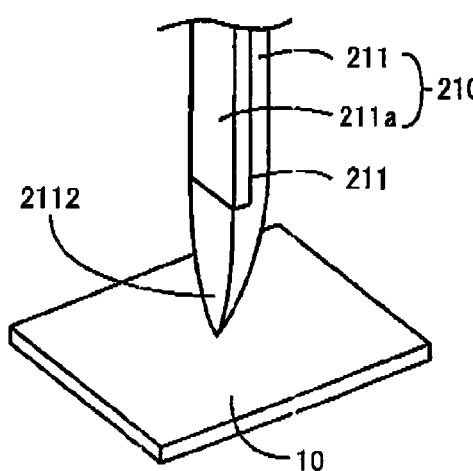
FIG. 8(a) is a three-dimensional view showing the contact part of the probe according to Embodiment 2 and FIG. 8(b) is a three-dimensional view showing a state in which the same contact part scrubs an electrode
Figure 8B:
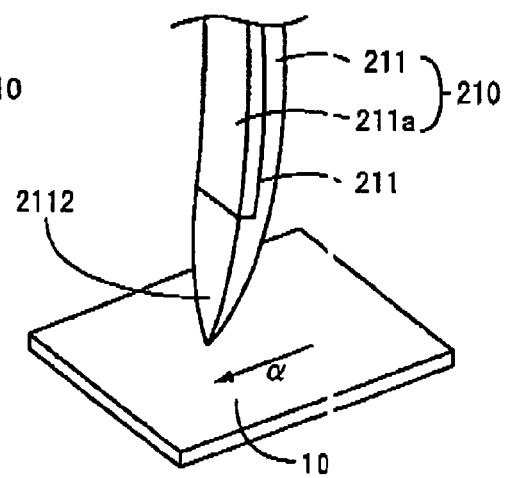

That is, although the deformation part 211a of the contact part 210 is formed of the shape memory alloy which can be contracted in the longitudinal direction of the base part 211 in this embodiment, it can be formed of a shape memory alloy which can be expanded in the longitudinal direction of the base part 211. In addition, the deformation part 211a of the contact part 210 may have any shape as long as it is provided at a portion of the end of the base part 211 in the width direction. For example, as shown in FIG. 6(a), the deformation part 211a having an arc shape as viewed from section may be provided at a lower portion of the end of the base part 211 in the width direction, or as shown in FIG. 6(b), the deformation part 211a having a triangle pyramid shape viewed from section may be provided at the lower portion of the end of the base part 211.

Although the contact part 210 is in the shape of the column in this embodiment, it may have another shape as long as it is rectilinear. The tip end of the contact part 210 is not necessarily sharply pointed. In addition, it is needless to say that a constitution of the probe card may have any constitution as long as it comprises the probe 200 and a substrate in which the probe 200 is provided.

What is claimed is:

1. A probe comprising:
an almost rectilinear contact part; and
a base end continued to the contact part,
characterized in that said contact part comprises;
a base part being formed of a first metal having a first thermal expansion coefficient and including a tip end, the tip end being adapted to contact an electrode of an object to be measured, and
a junction part which is formed of a second metal having a second thermal expansion coefficient different from that of the first metal and provided integrally along the base part exclusive of the tip end, said junction part having a width of the base part,
and in that said contact part is curved when a temperature of the contact part changes.

2. A probe comprising:
an almost rectilinear contact part; and
a base end continued to the contact part,
characterized in that said contact part comprises;
a base part being formed of an elastic metal and including a tip end, the tip end being adapted to contact an electrode of an object to be measured, and
a junction part which is integrally provided along said base part exclusive of the tip end, said junction part having a width of the base part,
in that said junction part is formed of a shape memory alloy which can be expanded or contracted in a longitudinal direction of said base part,
and in that said contact part is curved when a temperature of the contact part changes.

* * * * *